United States Patent
Bozdag et al.

(10) Patent No.: US 11,094,359 B2
(45) Date of Patent: Aug. 17, 2021

(54) HIGH RETENTION MULTI-LEVEL-SERIES MAGNETIC RANDOM-ACCESS MEMORY

(71) Applicant: Spin Memory, Inc., Fremont, CA (US)

(72) Inventors: Kadriye Deniz Bozdag, Sunnyvale, CA (US); Mustafa Pinarbasi, Morgan Hill, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 16/256,766

(22) Filed: Jan. 24, 2019

(65) Prior Publication Data

US 2020/0243124 A1 Jul. 30, 2020

(51) Int. Cl.
| | |
|---|---|
| *G11C 11/16* | (2006.01) |
| *H01L 27/22* | (2006.01) |
| *H01L 43/08* | (2006.01) |
| *H01L 43/02* | (2006.01) |
| *H01L 43/10* | (2006.01) |

(52) U.S. Cl.
CPC ........ *G11C 11/161* (2013.01); *G11C 11/1675* (2013.01); *H01L 27/228* (2013.01); *H01L 43/02* (2013.01); *H01L 43/08* (2013.01); *H01L 43/10* (2013.01)

(58) Field of Classification Search
CPC . G11C 11/161; G11C 11/1675; H01L 27/228; H01L 43/02; H01L 43/08; H01L 43/10
USPC ........................................................ 257/421
See application file for complete search history.

(56) References Cited

U.S. PATENT DOCUMENTS

| | | | | |
|---|---|---|---|---|
| 2002/0105823 | A1* | 8/2002 | Redon ................. | H01F 10/3254 365/97 |
| 2005/0189574 | A1* | 9/2005 | Nguyen ................ | G11C 11/161 257/295 |
| 2009/0257274 | A1* | 10/2009 | Itagaki ............... | G11C 13/0069 365/158 |
| 2009/0290410 | A1* | 11/2009 | Wang ...................... | H01L 43/08 365/158 |
| 2010/0072524 | A1* | 3/2010 | Huai ...................... | B82Y 25/00 257/295 |
| 2011/0141804 | A1* | 6/2011 | Apalkov ............. | G11C 11/1675 365/171 |
| 2013/0082339 | A1* | 4/2013 | Aggarwal ............... | H01L 43/08 257/421 |
| 2016/0315249 | A1* | 10/2016 | Kardasz ................ | G11C 11/161 |
| 2016/0372656 | A1 | 12/2016 | Pinarbasi et al. | |

* cited by examiner

*Primary Examiner* — Dzung Tran
(74) *Attorney, Agent, or Firm* — Zilka-Kotab, P.C.

(57) ABSTRACT

A magnetic memory pillar structure having a plurality of magnetic memory elements connected in series, wherein switching of individual memory elements in the pillar structure can be accomplished based on differing switching current values of the magnetic memory elements. Each of the plurality of memory elements advantageously have similar retention values in spite of the different switching current values (latency values) as a result of a precessional spin current injection structure provided in the memory element or memory elements having the lower switching current value.

14 Claims, 5 Drawing Sheets

HIGH RETENTION MULTI-LEVEL-SERIES MAGNETIC RANDOM-ACCESS MEMORY

FIELD OF THE INVENTION

The present invention relates to magnetic random-access memory (MRAM) and more particularly to a three-dimensional MRAM structure incorporating a spin torque structure for increased data retention.

BACKGROUND

Magnetic Random-Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as a "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power.

SUMMARY

The present invention provides a magnetic memory structure that includes a first magnetic memory element having a first write current value, and a second magnetic memory element having a second write current value that is lower than the first write current value. The second magnetic memory element structure has a spin current structure.

By designing the second magnetic memory element to have a lower write current value than the first magnetic memory element structure, the memory elements can be individually switched, even if they are connected in series in the same pillar structure. This can be accomplished by adjusting the amount of write current to switch only the lower write current or by first applying a high write current to switch both write elements and then applying a lower write current to re-set the memory state of the second, lower write current, element.

The presence of the spin current structure in the second magnetic memory element having the lower write current value advantageously allows the second magnetic memory element to have a higher retention value while still having a lower write current value. In this way, the second write element can have a retention value that is similar to that of the first magnetic write element, thereby increasing the overall retention value for the magnetic memory system as a whole.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
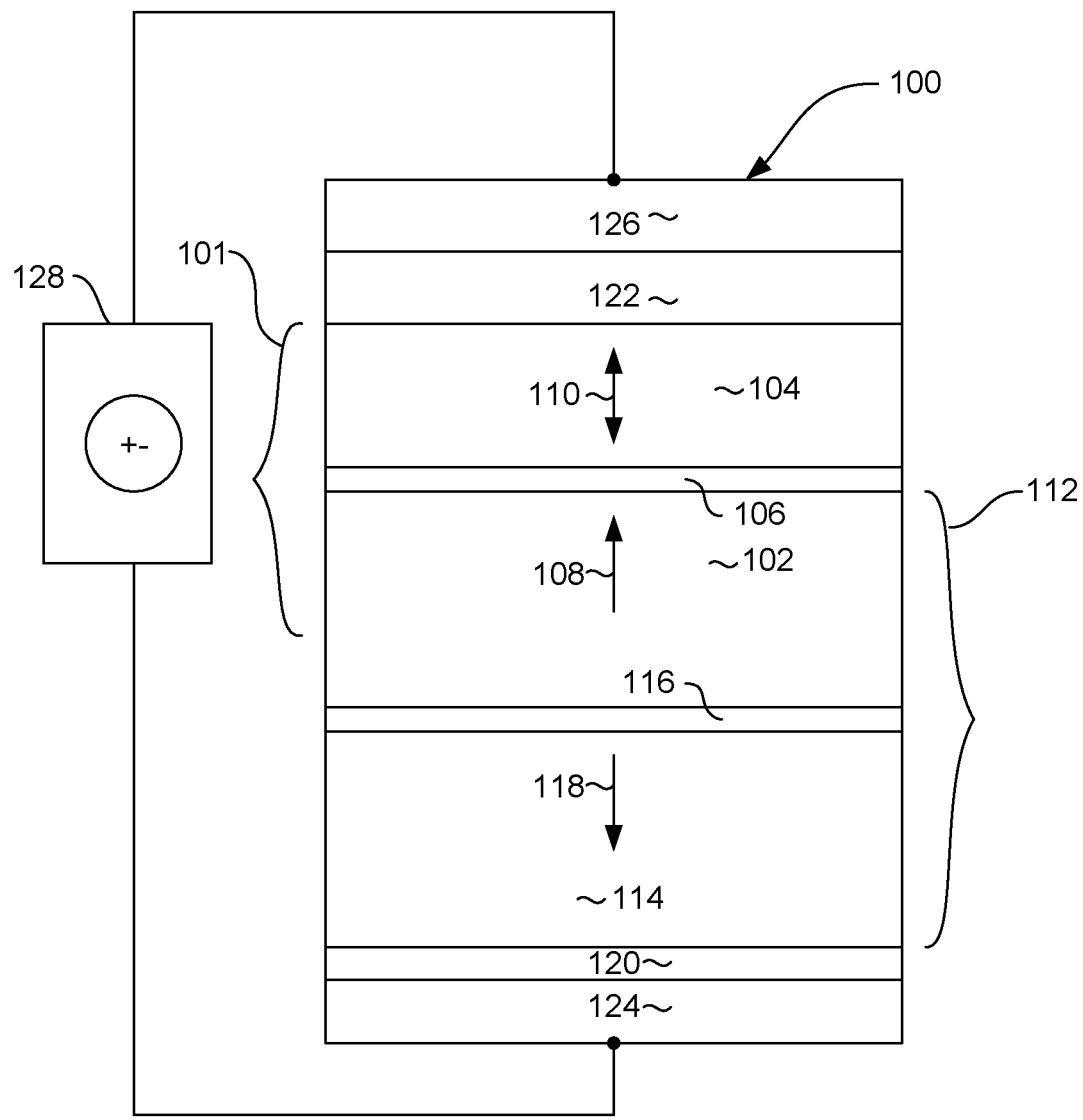
FIG. 1 is a schematic, cross sectional view of a perpendicular magnetic tunnel junction (pMTJ) element.

Referring now to FIG. 1, a magnetic memory element 100 can be in the form of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer 104 has a magnetization 110 that can be in either of two directions perpendicular to the plane of the layer 104. While the magnetization 110 of the free layer 104 remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure such as a Synthetic Anti-Ferromagnet (SAF) 112 that can include a magnetic balancing bottom layer 114, and a non-magnetic, antiparallel coupling layer (such as Ru) 116 located between the bottom SAF layer 114 and reference layer 102. The antiparallel coupling layer 116, which will be described in greater detail herein below, can be constructed to have a composition and thickness such that it will couple the layers 114, 102 in an antiparallel configuration. The antiparallel coupling between the layers 114, 102 ensures that the magnetization 108 of the reference layer 102 is in a direction opposite to the direction of magnetization 118 of the bottom SAF layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing and from exposure to ambient atmosphere. Also, electrodes 124, 126 may be provided at the bottom and top of the memory element 100. The electrodes 124, 126 may be constructed of a non-magnetic, electrically conductive material such as one or more of Ta, W, Cu and Al can provide electrical connection with circuitry 128 that can include a current source and can further include circuitry such as CMOS circuitry for reading an electrical resistance across the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to efficiently pass through the barrier layer 106 to the reference layer 102. As a result, the electrons having an opposite spin will be reflected at barrier layer 106, and return to the free layer 104 with a spin polarization opposite that of the reference layer 102. These spin polarized electrons cause a spin torque that causes the magnetization 110 of the free layer 104 to flip from an upward direction to a downward direction.

Figure 2:
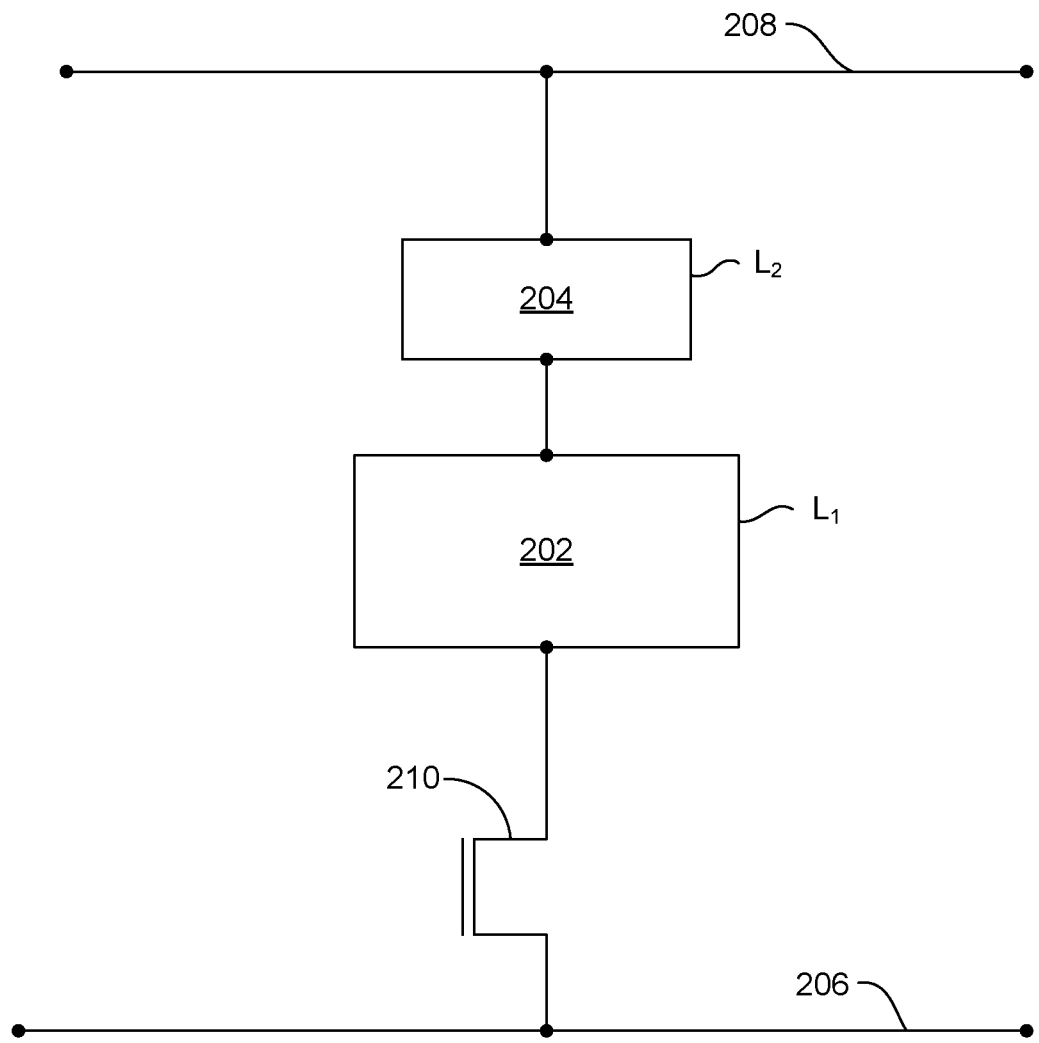
FIG. 2. is a schematic view of a three-dimensional magnetic memory array according to an embodiment.

One way to increase data density in a magnetic random-access memory (MRAM) array is to form the array as a three-dimensional structure. FIG. 2 shows a schematic view of such a structure. In FIG. 2, a first plurality of magnetic memory elements 202 and 204 are arranged in series with one another. This arrangement can be in the form of a pillar structure, such as will be described in greater detail herein below. FIG. 2 shows two memory element structures 202, 204, although some other number greater than 2 memory element structures could be included as well.

With continued reference to FIG. 2, the memory element structures 202, 204 are connected in series between a word or source line 206 and a bit line 208. A transistor such as a CMOS transistor 210 can be provided between the stack of memory elements 202, 204 and the word or source line 206. The memory elements 202, 204 can be magnetic tunnel junction elements, preferably perpendicular magnetic tunnel junction elements (pMTJ), such as those described above with reference to FIG. 1 and can have structures which will be described in greater detail herein below.

To write data to the magnetic memory elements 202, 204, the transistor 210 can be switched on so as to pass a write current through the memory cells. This write current must be sufficiently high to switch the magnetic state of the magnetic free layer (e.g. memory state 110 of layer 104 in FIG. 1). The amount of switching current needed to switch the magnetic state of each memory elements 202, 204 is determined by the particular design parameters each memory element 202, 204. In order to read data from the memory elements, 202, 204, the electrical resistance across the memory elements 202, 204 can be read in order to determine whether each of the memory elements 202, 204 is in a high resistance state (0) or a low resistance state (1).

However, as seen in the schematic diagram of FIG. 2, the memory elements 202, 204 are connected in series between lines 206, 208. This raises the challenge of how to write or read data to or from an individual one of the memory elements 202, 204. One way in which this can be accomplished is by designing the memory elements 202, 204 to each have a unique latency that is different from the other memory element. Latency refers to the ease with which a memory element can be switched, and relates to the amount of write current needed to switch the memory state of the memory element (i.e. write current or write power).

For example, as shown in FIG. 2, memory element 202 can be designed to have a first latency $L_1$, and the second memory element 204 can be designed to have a second latency $L_2$ that is different from $L_1$. For example, the latency $L_1$ can be higher than the latency $L_2$. This means that memory element 204 can be switched using a lower switching current than would be needed to switch the memory state of the memory element 202. This difference in latency can be used to individually switch the memory state of a selected one of the memory elements 202, 204. For example, if only memory element 204 is to be switched and not memory element 202, then a switching current can be applied that is equal to or greater than the switching current of memory element 204, but less than the switching current needed to switch memory element 202 ($I_{204} \leq I < I_{202}$). In that case, memory element 204 will be switched, while memory element 202 will be unaffected. On the other hand, if only memory element 202 is to be switched, then a first current can be applied that is greater than or equal to the switching current of elements 202 and 204 ($I_{204} < I_{202} \leq I$), and then a second current can be applied that is greater than or equal to the switching current of memory element 204 but less than the switching current of memory element 202 ($I_{204} \leq I < I_{202}$). The first current will switch both of memory elements 202, and 204, and the second current will re-set memory element 204 to its original state while leaving memory element 202 unaffected.

Figure 3:
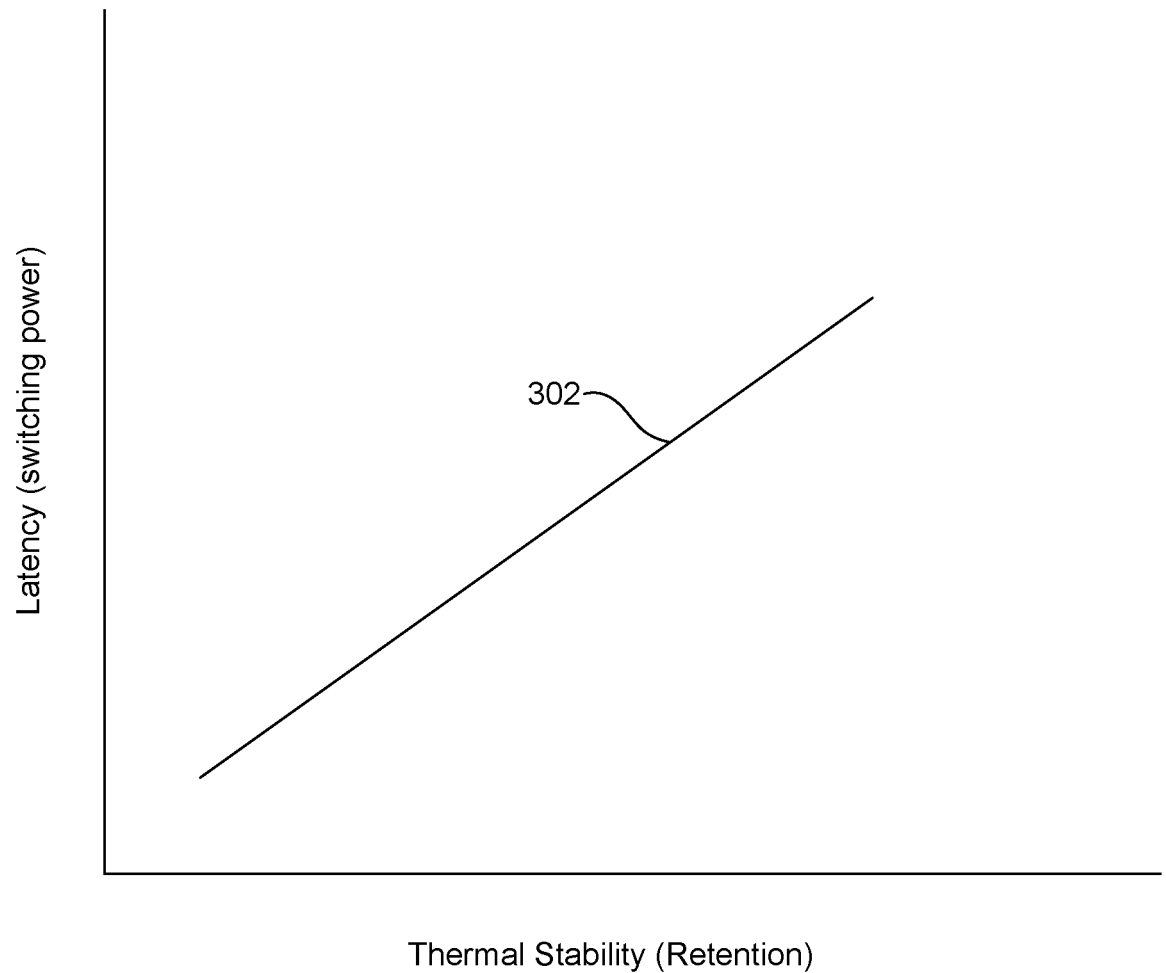
FIG. 3 is a graph illustrating a relationship between latency and thermal stability in for a magnetic memory element.

As described above, in order for this individual switching to function in the multi-element pillar structure, one of the magnetic memory elements 204 has a lower latency than the other magnetic memory element 202. However, the design of magnetic memory elements involves trade-offs between varying, often conflicting, performance parameters. In general, in a magnetic memory element (e.g. perpendicular magnetic tunnel junction (pMTJ)) a lower latency and lower switching power is associated with a lower retention and lower thermal stability. This relationship is illustrated in FIG. 3, which shows the generally linear relationship between latency (switching power) and thermal stability (retention) as indicated by line 302. The latency relates to the amount of power needed to switch the magnetic state of the memory element and thermal stability relates to the robustness of the recorded magnetic bit over time and at different thermal stresses. Therefore, designing one element 204 to have a lower latency than element 202, would result in the unfortunate reduction in data retention. As a result, the lower latency memory element 204 become the weak link in the system with regard to data retention. Even if the element 202 has a desirably high data retention, the data retention of the system as a whole is limited by the lower data retention of memory element 204. The present invention, as described in further detail herein below, overcomes this challenge by allowing the memory elements 202, 204 to have different latencies, while also allowing both memory elements 202, 204 to have a desirable high data retention.

Figure 4:
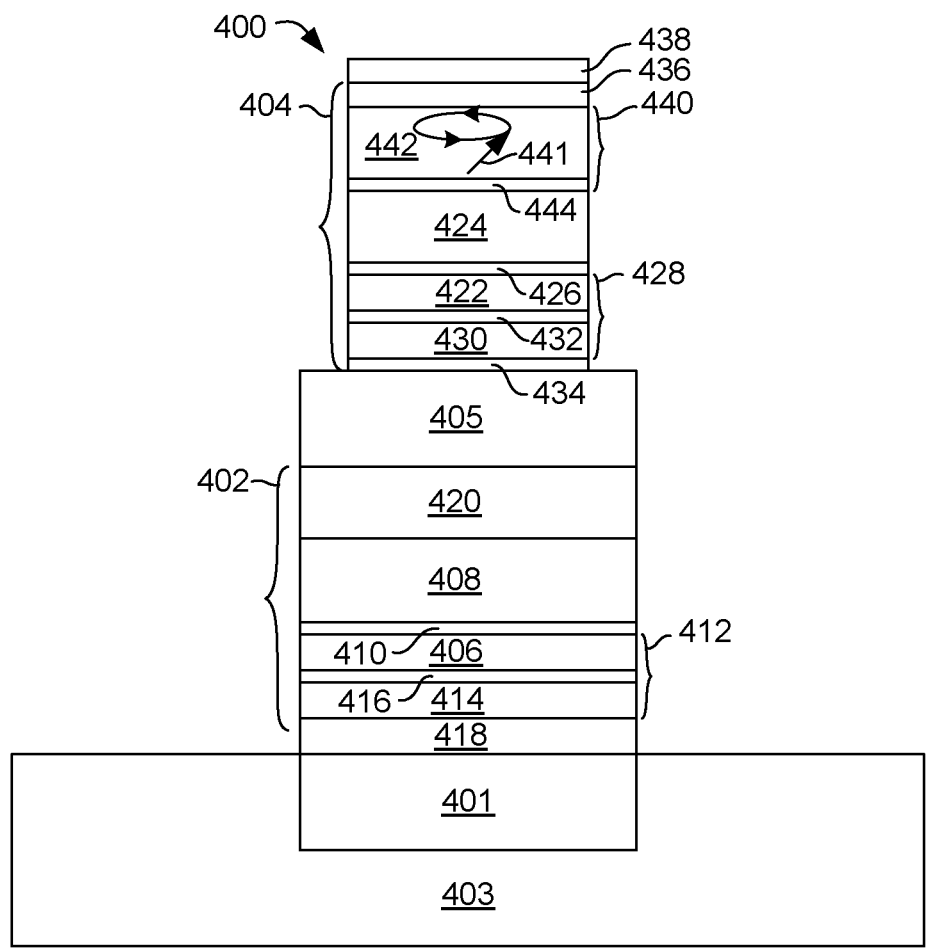
FIG. 4 is a schematic, side, cross-sectional view of a magnetic memory array pillar according to an embodiment.

FIG. 4 is a side, cross-sectional view of a magnetic memory pillar structure 400 according to an embodiment of the invention. The magnetic memory pillar 400 includes a first magnetic memory element 402 formed below a second magnetic memory element 404. The memory element pillar structure 400 can be formed on circuitry 401 such as CMOS circuitry that is formed in a substrate 403, such as a semiconductor (e.g. Si) substrate. A non-magnetic, electrically conductive layer 405 can be provided between the first and second memory elements 402, 404 in order to separate and electrically connect the memory elements 402, 404.

The first magnetic memory element 402 includes a magnetic reference layer 406 having a pinned perpendicular magnetization, a magnetic free layer 408 having a free, perpendicular magnetization, and a non-magnetic barrier layer 410 located between the magnetic reference layer 406 and the magnetic free layer 408. The magnetic reference layer and magnetic free layer 406, 408 can each be constructed of one or more of various magnetic materials such as CoFe, CoFeB, a Heusler alloy, etc. The non-magnetic barrier layer 410 can be constructed of an oxide, preferably magnesium oxide MgO.

The magnetic reference layer 406 can be part of a synthetic antiferromagnetic structure (SAF structure) 412 that can include a magnetic keeper layer 414 and a non-magnetic antiparallel exchange coupling layer 416, such as Ru that has a thickness that is chosen to strongly antiparallel couple the layers 414, 406. A seed layer 418 can be formed at the bottom of the first memory element 402 to initiate a desired grain structure in the above deposited layers of the memory element 402. In addition, a cap layer 420 such as Ta or Ru can be formed at the top of the memory element structure 402.

With continued reference to FIG. 4, the second memory element 404 can have a magnetic reference layer 422 having a magnetization that is fixed in a perpendicular direction, a magnetic free layer 424 having a magnetization that is free to move between two perpendicular directions and a non-magnetic barrier layer 426 located between the magnetic reference layer 422 and the magnetic free layer 424. Each of the magnetic reference layer 422 and magnetic free layer 424 can be formed of one or more of, for example, CoFe, CoFeB, a Heusler alloy, etc. The barrier layer 426 can be formed of an oxide, and is preferably formed of magnesium oxide (MgO).

The magnetic reference layer 422 can be a part of a synthetic antiferromagnetic structure (SAF) 428 that can include the reference layer 422, and a magnetic keeper layer 430, both of which are antiferromagnetically coupled across a thin, non-magnetic antiparallel coupling layer 432, which can be constructed of a material such as Ru. A seed layer 434 can be provided at the bottom of the second magnetic memory element 404 in order to initiate a desired crystalline structure in the above formed layers. In addition, a cap layer 436 such as Ta or some other suitable material can be provided at the top of the second memory element 404 in order to protect the other layers of the memory element 404. In addition, an upper electrode 438 can be formed over the top of the second memory element 404. The second electrode 438 can be formed of a material such as Cu or some other non-magnetic, electrically conductive material and may form a "bit" line for the memory array system.

With continued reference to FIG. 4, the second magnetic memory element 404 has a design that is configured so that it has a lower switching current than the first memory element 402. This difference in switching current can be achieved by varying several material or dimensional parameters. For example, as seen in FIG. 4, the second memory element 404 can be formed to have a smaller diameter than the first memory element 402. This can, for example, reduce the perpendicular magnetic shape anisotropy of the second memory element 404 relative to that of the first memory element 402. As discussed above, a reduction in switching current generally corresponds to a reduction in data retention, which is undesirable in ensuring reliable, long lasting data storage. However, as described herein below, the second memory element includes a structure which allows the second memory element to have a low switching current, without a reduction in data retention. As a result, the second memory element 404 can have a data retention value that is similar to or the same as that of the first memory element 402 while still having a reduced write current value. For example, that second memory element 404 can have a data retention value that is within plus or minus 10% of the data retention value of the first magnetic memory element 402.

With continued reference to FIG. 4, the second magnetic memory element 404 includes a spin current structure 440 that can be at or near the top of the second memory element 404. The spin current structure 440 is formed over and adjacent to the magnetic free layer, and can be in the form of a Precessional Spin Current (PSC) structure, as will be described. The spin current structure 440 can include a Precessional Spin Current magnetic layer 442 (which will be referred to herein as PSC layer 442, and a non-magnetic spacer layer 444 located between the magnetic spin polarization layer 442 and the magnetic free layer 424. The PSC layer 442 is formed of a magnetic material and is configured to have a magnetic anisotropy in a direction parallel to the plane of the layer. The PSC layer has a magnetization that can oscillate in a precessional manner, as indicated by arrow 441 in reaction to spin torque forces of electrons flowing through the spin polarization layer. The non-magnetic layer 444 physically separates the magnetic free layer 424 from the PSC layer 442.

The non-magnetic layer 444 promotes strong magnetic and/or electronic coupling such that the magnetic direction of the PSC layer 442 follows the precession cycle of the magnetic free layer 424. In other words, the non-magnetic layer 444 couples the magnetic direction of the PSC magnetic layer 442 to the magnetic direction of the magnetic free layer 424. The nonmagnetic layer 444 transmits spin current efficiently from the PSC magnetic layer 350 into the magnetic free layer 424, because it preferably has a long spin diffusion length. The non-magnetic layer 444 also promotes good microstructure and high tunneling magnetoresistance (TMR and helps keep the damping constant of the magnetic free layer low. Further embodiments and descriptions of precessional spin current structures for use in conjunction with magnetic tunnel junction elements can be found with reference to commonly assigned U.S. Patent Publication No. US 2016/0372656 A1, entitled PRECESSIONAL SPIN CURRENT STRUCTURE FOR MRAM, which is incorporated herein by reference.

Figure 5:
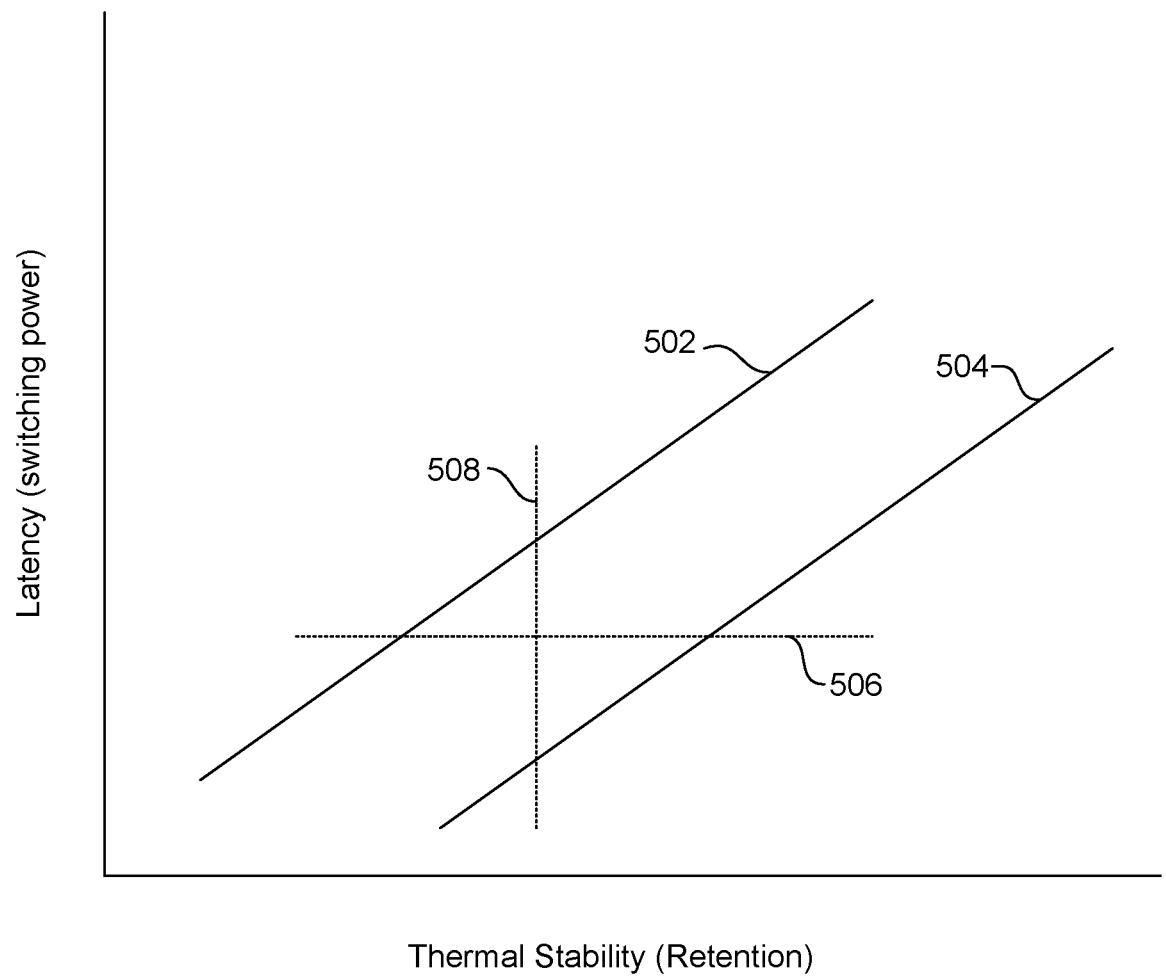
FIG. 5 is a graph illustrating a relationship between latency and thermal stability for magnetic memory elements with and without PSC structures.

The presence of the spin current structure 440 in the second memory element 404 advantageously increases retention and thermal stability for a given write current. This can be seen more clearly with reference to FIG. 5 which illustrates a relationship between latency or switching power and thermal stability or retention in a magnetic tunnel junction (MTJ) memory element. Line 502 shows the relationship between latency and thermal stability for an MTJ memory element that does not include a spin current structure, and line 504 shows the relationship between latency and thermal stability for an MTJ memory element that does include a spin current structure such as that described above. Dashed line 506 shows that for a given latency, the MTJ memory element having the spin current structure has a higher thermal stability or retention value than the memory element that does not include such a spin current structure. Conversely, dashed line 508 shows that for a given thermal stability (retention), an MTJ element having a spin current structure has a lower latency (switching power) than the memory element that does not include the spin current structure. Therefore, in a structure such as that described above in FIG. 4, wherein memory element 402 does not include a spin current structure, and memory element 404 does include such a spin current structure, the second memory element 404 can be constructed to have a lower latency (switching power) than the first memory element 402, which also having the same or similar thermal stability (retention). In this way, a memory system can be designed to a desired target thermal stability (retention) while also providing the ability to switch multiple memory elements in the same pillar structure through the use of differing switching powers as described above.

It should be pointed out, however that, while the above embodiments have been described with the upper memory element 404 having the spin current structure and lower switching power than the lower memory element 402, this by way of example only. It would also be possible to form a pillar structure wherein the memory element having the lower switching power (latency) and spin current structure is formed beneath a memory element having a higher switching power (latency) and not having any spin current structure. Also, while a pillar memory element pillar structure has been described above as having two memory elements of differing switching power, other structures having other numbers of memory element (e.g. three or four memory elements) in a single pillar structure would also be possible.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:
1. A magnetic memory structure comprising:
a first magnetic memory element having a first write current value; and
a second magnetic memory element having a second write current value that is less than the first write current value; wherein the second magnetic memory element includes a spin current structure, and the first magnetic memory element structure does not include a spin current structure;

wherein the first and second memory elements are formed on a pillar structure and are electrically connected by a non-magnetic electrically conductive layer located between the first and second magnetic memory elements.

2. The magnetic memory structure as in claim 1, wherein the spin current structure is a precessional spin current structure.

3. The magnetic memory structure as in claim 1, wherein:
each of the first and second magnetic memory elements includes a magnetic free layer, a magnetic reference layer and a non-magnetic barrier layer located between the magnetic free layer and the magnetic reference layer; and
the spin current structure further comprises a spin current magnetic layer, and a non-magnetic layer located between the spin current magnetic layer and the magnetic free layer of the second magnetic memory element.

4. The magnetic memory structure as in claim 1, wherein the second magnetic memory element has a retention value that is similar to a retention value of the first magnetic memory element.

5. The magnetic memory structure as in claim 1, wherein the second magnetic memory element has a retention value that is within 10 percent of a retention value of the first magnetic memory element.

6. The magnetic memory structure as in claim 1, wherein the first and second magnetic memory elements are electrically connected in series with one another.

7. The magnetic memory structure as in claim 1, wherein each of the first and second magnetic memory elements includes a magnetic free layer, a magnetic reference layer and a non-magnetic barrier layer located between the magnetic reference layer and the magnetic free layer, and wherein the spin current structure is located adjacent to the magnetic free layer of the second magnetic memory element.

8. The magnetic memory structure as in claim 1, wherein the first magnetic memory element has first electrical characteristics based on the geometry (size) of the first magnetic memory element, dielectric composition and deposition conditions of the first magnetic memory element and Resistance Area product (RA product) of the first magnetic memory element, the second magnetic memory element has second electrical characteristics based on the geometry (size) of the second magnetic memory element, dielectric composition and deposition conditions of the second magnetic memory element and Resistance Area product (RA product) of the second magnetic memory element.

9. The magnetic memory structure as in claim 1, wherein the first magnetic memory element has first magnetic characteristics based on the magnetic anisotropy (perpendicular and bulk) of the first magnetic memory element, the magnetic free layer composition and thickness of the first magnetic memory element and offset field on the magnetic free layer of the first magnetic memory element, the second magnetic memory element has second magnetic characteristics based on the magnetic anisotropy (perpendicular and bulk) of the second magnetic memory element, the magnetic free layer composition and thickness of the second magnetic memory element and offset field on the magnetic free layer of the second magnetic memory element.

10. The magnetic memory structure as in claim 1, further comprising a third memory element connected in series with the first and second magnetic memory elements, the third magnetic memory element including a spin current structure and having a write current value that is less than either of the first and second magnetic memory elements.

11. The magnetic memory structure as in claim 1, wherein the first and second magnetic memory elements are formed on a pillar structure and wherein the second magnetic memory element is formed above the first magnetic memory element.

12. The magnetic memory structure as in claim 1, wherein the first and second magnetic memory elements are formed on a pillar structure and wherein the second magnetic memory element is formed beneath the first magnetic memory element.

13. The magnetic memory structure as in claim 1, wherein the first memory element can be in the high or low resistance state and the second memory element can be in the high or low resistance state providing in total 4 different combined resistance states.

14. A magnetic memory structure as in claim 1, wherein the resistance state of the first memory element and the resistance state of the second memory element can be controlled by applied current or voltage through the magnetic memory structure.

* * * * *